US008679886B2

United States Patent
Hsu et al.

(10) Patent No.: US 8,679,886 B2
(45) Date of Patent: Mar. 25, 2014

(54) MICROELECTRONIC DEVICE AND MEMS PACKAGE STRUCTURE AND FABRICATING METHOD THEREOF

(71) Applicant: PixArt Imaging Inc., Hsinchu (TW)

(72) Inventors: Hsin-Hui Hsu, Hsinchu (TW); Sheng-Ta Lee, Hsinchu (TW); Chuan-Wei Wang, Hsinchu (TW)

(73) Assignee: Pixart Imaging Inc., Hsinchu (TW)

( * ) Notice: Subject to any disclaimer, the term of this patent is extended or adjusted under 35 U.S.C. 154(b) by 0 days.

(21) Appl. No.: 13/727,072

(22) Filed: Dec. 26, 2012

(65) Prior Publication Data

US 2013/0119441 A1     May 16, 2013

Related U.S. Application Data

(63) Continuation of application No. 12/756,558, filed on Apr. 8, 2010, now Pat. No. 8,372,675.

(30) Foreign Application Priority Data

Aug. 11, 2009  (TW) ............................... 98126961 A

(51) Int. Cl.
*H01L 21/00* (2006.01)
*H01L 29/84* (2006.01)

(52) U.S. Cl.
USPC 438/50; 257/415; 257/E21.002; 257/E29.324

(58) Field of Classification Search
None
See application file for complete search history.

(56) References Cited

U.S. PATENT DOCUMENTS

| 5,313,089 | A | 5/1994 | Jones, Jr. | |
|---|---|---|---|---|
| 5,578,523 | A * | 11/1996 | Fiordalice et al. | ............ 438/633 |
| 5,760,455 | A | 6/1998 | Hierold et al. | |
| 5,798,283 | A | 8/1998 | Montague et al. | |
| 6,238,580 | B1 | 5/2001 | Cole et al. | |
| 6,546,798 | B1 | 4/2003 | Waters et al. | |
| 6,550,330 | B1 | 4/2003 | Waters et al. | |
| 6,581,465 | B1 | 6/2003 | Waters et al. | |
| 6,636,653 | B2 | 10/2003 | Miracky et al. | |
| 6,707,593 | B2 | 3/2004 | Le et al. | |
| 6,808,954 | B2 | 10/2004 | Ma et al. | |
| 6,822,304 | B1 | 11/2004 | Honer | |
| 6,861,633 | B2 | 3/2005 | Osborn | |
| 6,936,494 | B2 | 8/2005 | Cheung et al. | |
| 6,937,778 | B2 | 8/2005 | Winfield et al. | |
| 6,949,866 | B2 | 9/2005 | Miller et al. | |

(Continued)

FOREIGN PATENT DOCUMENTS

| CN | 1521847 | 8/2004 |
|---|---|---|
| CN | 1581438 | 2/2005 |
| CN | 101217185 | 7/2008 |

*Primary Examiner* — Michael Lebentritt
*Assistant Examiner* — Kevin Quinto
(74) *Attorney, Agent, or Firm* — WPAT, PC; Justin King

(57) ABSTRACT

A microelectronic device including a substrate, at least a semi-conductor element, an anti metal ion layer, a non-doping oxide layer and a MEMS structure is provided. The substrate has a CMOS circuit region and a MEMS region. The semi-conductor element is configured within the CMOS circuit region of the substrate. The anti metal ion layer is disposed within the CMOS circuit region of the substrate and covers the semi-conductor element. The non-doping oxide layer is disposed on the substrate within the MEMS region. The MEMS structure is partially suspended above the non-doping oxide layer. The present invention also provides a MEMS package structure and a fabricating method thereof.

5 Claims, 11 Drawing Sheets

(56) References Cited

U.S. PATENT DOCUMENTS

| | | |
|---|---|---|
| 7,153,720 B2 | 12/2006 | Augusto |
| 7,258,012 B2 | 8/2007 | Xie |
| 7,402,449 B2 | 7/2008 | Fukuda et al. |
| 7,417,307 B2 | 8/2008 | Haluzak et al. |
| 7,435,612 B2 | 10/2008 | Xiao et al. |
| 7,723,141 B2 | 5/2010 | Robert |
| 8,062,497 B2 | 11/2011 | Witvrouw et al. |
| 2002/0001778 A1 | 1/2002 | Latchford et al. |
| 2002/0175284 A1 | 11/2002 | Vilain |
| 2006/0205106 A1* | 9/2006 | Fukuda et al. ............ 438/52 |
| 2007/0190680 A1 | 8/2007 | Fukuda et al. |
| 2007/0269920 A1 | 11/2007 | Yu et al. |
| 2008/0217787 A1 | 9/2008 | Lee et al. |
| 2009/0075415 A1 | 3/2009 | Nakamura |
| 2009/0090693 A1 | 4/2009 | Wang |
| 2010/0181631 A1 | 7/2010 | Lacey |
| 2011/0037132 A1 | 2/2011 | Hsu et al. |
| 2011/0079081 A1 | 4/2011 | Weiss et al. |
| 2011/0227176 A1 | 9/2011 | Wang |

* cited by examiner

MICROELECTRONIC DEVICE AND MEMS PACKAGE STRUCTURE AND FABRICATING METHOD THEREOF

CROSS-REFERENCE TO RELATED APPLICATION

This application is continuation application of U.S. patent application Ser. No. 12/756,558, filed on Apr. 8, 2010, and hereby incorporates the content of this application by reference.

BACKGROUND

This application claims priority to a Taiwan application No. 098126961 filed Aug. 11, 2009.

1. Technical Field

The present invention relates to a microelectronic device, a MEMS package structure and fabricating methods thereof, and more particularly to a microelectronic device, a MEMS package structure and fabricating methods thereof with low production cost.

2. Description of the Related Art

Micro Electromechanical System (MEMS) technique has established a whole new technical field and industry. The MEMS technique has been widely used in a variety of microelectronic devices that have electronic and mechanical properties, for example, pressure sensors, accelerators and micromicrophones.

For a conventional microelectronic device including MEMS elements, the interior semi-conductor circuits are generally fabricated by CMOS process, and the MEMS elements are fabricated by external micro-machining process. However, the fabrication procedure of the conventional microelectronic device is complicated and difficultly, so the microelectronic device tends to have a relatively high production cost and fail to achieve commercialization.

What needed, therefore, is an improved fabricating method for microelectronic device that can overcome the above-mentioned shortcomings.

BRIEF SUMMARY

The present invention relates to a microelectronic device without the stiction problem associated with the MEMS elements.

The present invention relates to a MEMS package structure for sealing MEMS elements effectively.

The present invention relates to a fabricating method of a MEMS package structure that can simplify fabrication procedure and reduce production cost.

The present invention provides a microelectronic device including a substrate, a semi-conductor element, an anti metal ion layer, a non-doping oxide layer and a MEMS structure. The substrate has a CMOS circuit region and a MEMS region. The semi-conductor element is configured within the CMOS circuit region of the substrate. The anti metal ion layer is disposed on the substrate within the CMOS circuit region and covers the semi-conductor element. The non-doping oxide layer is disposed on the substrate within the MEMS region. The MEMS structure is partially suspended above the non-doping oxide layer.

The present invention provides a MEMS package structure including a substrate, a MEMS structure, a metallic layer, a mask layer and a packaging layer. The MEMS structure is partially suspended above the substrate. The metallic layer is disposed above the MEMS structure and has a plurality of first openings. The mask layer is disposed above the metallic layer and has a plurality of second openings. The second openings and the first openings staggered with each other. The packaging layer is disposed on the mask layer and fills into the second openings so as to connect to the metallic layer.

The present invention provides a fabricating method of MEMS package, which includes the following steps. First, a substrate is provided. Second, a plurality of metallic layers, a plurality of contact plugs and a plurality of oxide layers are formed on the substrate to compose a MEMS structure. Moreover, one of the metallic layers disposed above the MEMS structure has a plurality of first openings. Next, a mask layer with a plurality of second openings is formed on the metallic layer. The second openings and the first openings are staggered with each other. Predetermined portions of the oxide layers located within the MEMS region are removed by employing the first openings and the second openings as etching channels and thereby the MEMS structure is partially suspended above the substrate. Then, a packaging layer is formed on the mask layer and filled into the second openings and thereby the MEMS structure is sealed between the metallic layers and the substrate.

In the fabricating method of the microelectronic device of the present invention, the CMOS circuit and the MEMS element may be integrated into a wafer by CMOS process. Furthermore, the MEMS structure can be packaged by CMOS process so that the packaging procedure of the microelectronic device can be simplified, and thus the production cost of the microelectronic device can be reduced. In addition, the microelectronic device and the fabricating method thereof can solve the stiction problem that is associated with the MEMS element due to phosphorus ions. Therefore, the performance of the microelectronic device can be improved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
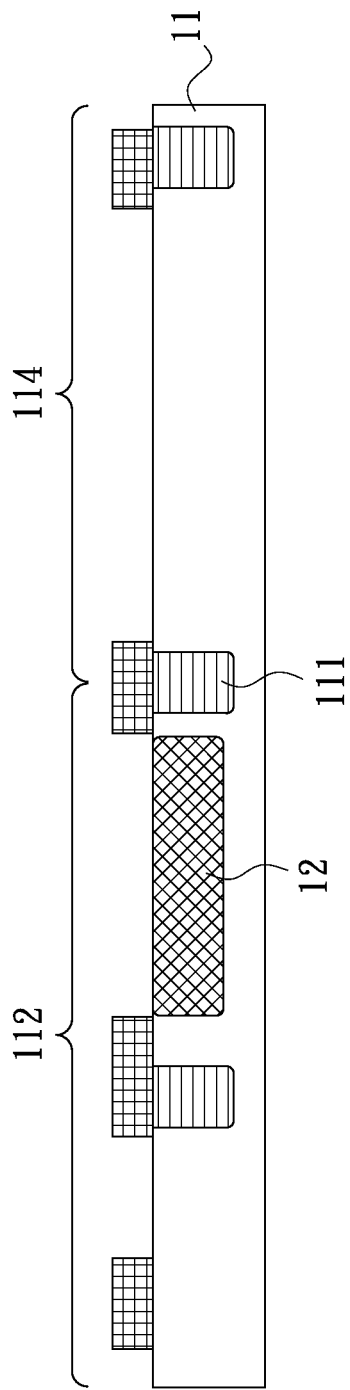
FIGS. 1A to 1E are schematic views of a microelectronic device during a fabricating process thereof according to an embodiment of the present invention.

FIGS. 1A to 1E are schematic views of a microelectronic device during a fabricating process thereof according to an embodiment of the present invention. Referring to FIG. 1A, firstly, a substrate 11 having a CMOS circuit region 112 and a MEMS region 114 is provided. The substrate 11 can be a silicon substrate or a substrate of silicon on insulator (SOI). Secondly, a semi-conductor element 12 is formed in the CMOS circuit region 112 of the substrate 11. In alternative embodiment, a plurality of semi-conductor elements 12 can be formed in the CMOS circuit region 112 and spaced by shallow trench insulation (STI) 111 therebetween.

Figure 1B:
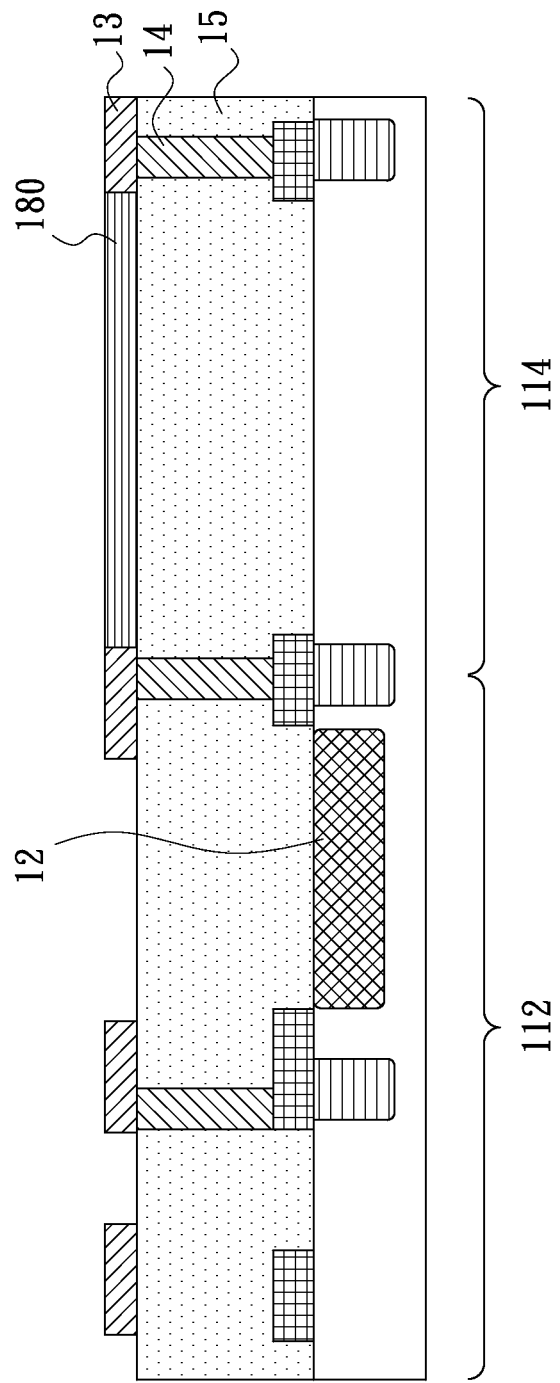

Referring to FIG. 1B, at least a metallic layer 13 and at least an oxide layer 15 are formed on the substrate 11, and a plurality of contact plugs 14 are formed in the oxide layer 15. Next, a protective layer 180 is formed on a portion of the oxide layer 15 within the MEMS region 114. In this embodiment, material of the protective layer 180 can be amorphous silicon or silicon carbide.

Detailedly, the oxide layer 15 is formed on the substrate 11 firstly, and then a portion of the oxide layer 15 is etched to form a plurality of via holes (not labeled) that penetrate through the oxide layer 15. Subsequently, a conductive material fills in the via holes so as to form the contact plugs 14, and then the metallic layer 13 that is electrically connected with the contact plugs 14 is formed on the oxide layer 15. In this embodiment, material of the metallic layer 13 can be aluminum, material of the contact plugs 14 can be tungsten and material of the oxide layer 15 can be silicon oxide or other oxides.

Figure 1C:
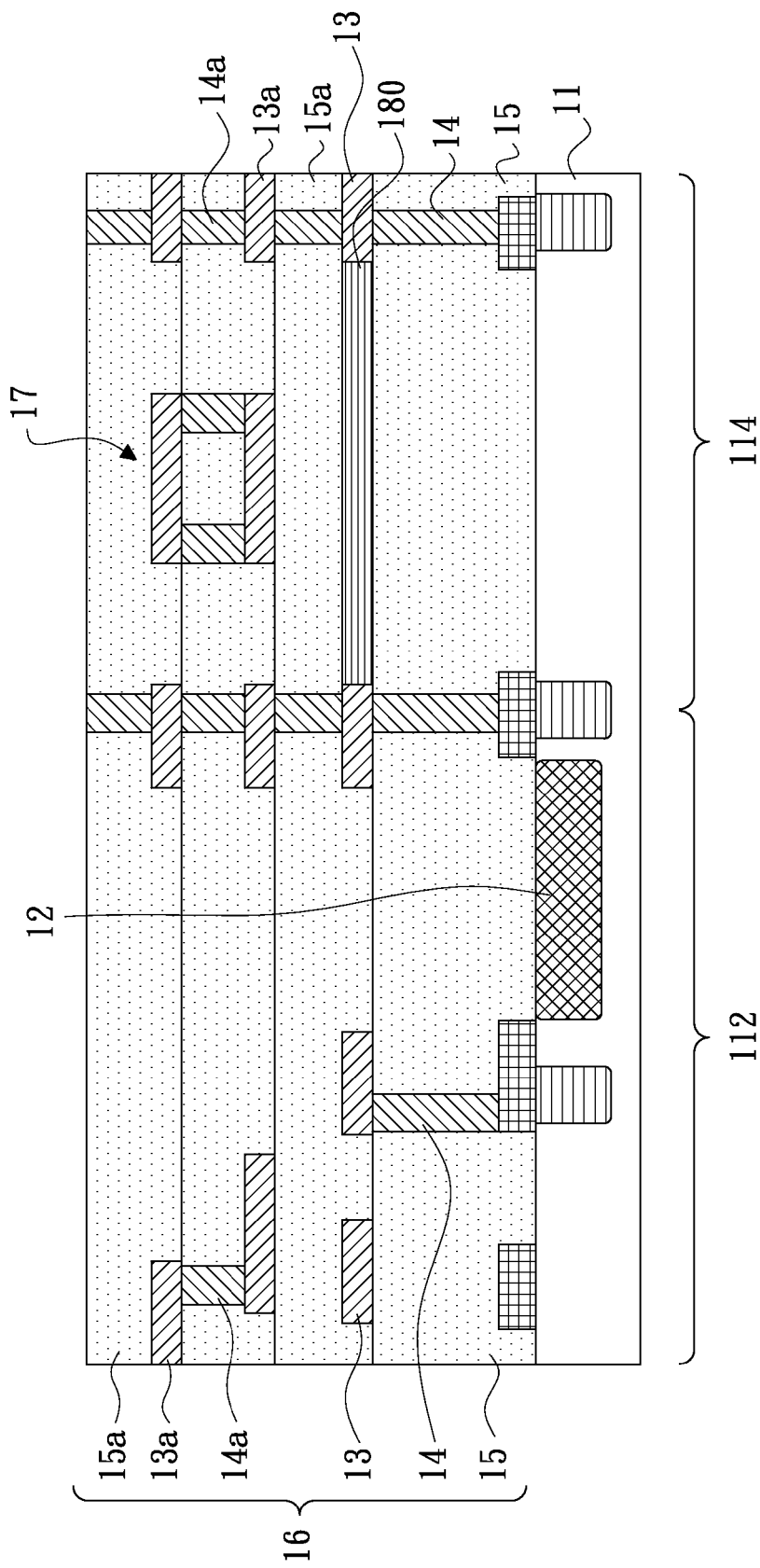

Referring to FIG. 1C, a plurality of metallic layers 13a, a plurality of contact plugs 14a and a plurality of oxide layers 15a are formed on the oxide layer 15 and the protective layer 180. The metallic layers 13a and the oxide layers 15a are interlaced with each other. The contact plugs 14a are formed in the oxide layers 15a and connected with metallic layers 13a correspondingly. Portions of the metallic layers 13a, the contact plugs 14a, the oxide layers 15a, the metallic layer 13, the contact plugs 14 and the oxide layer 15 located within the CMOS circuit region 112 compose an interconnecting structure 16. Portions of the metallic layers 13a, the contact plugs 14a and the oxide layers 15a located within the MEMS region 114 compose a MEMS structure 17.

As described above, steps of forming the metallic layers 13a, the contact plugs 14a and the oxide layers 15a can be the same as or similar to that of forming the metallic layer 13, the contact plugs 14 and the oxide layer 15 correspondingly. Material of the metallic layers 13a, the contact plugs 14a and the oxide layers 15a can be the same as or similar to that of the metallic layer 13, the contact plugs 14 and the oxide layer 15 correspondingly.

Figure 1D:
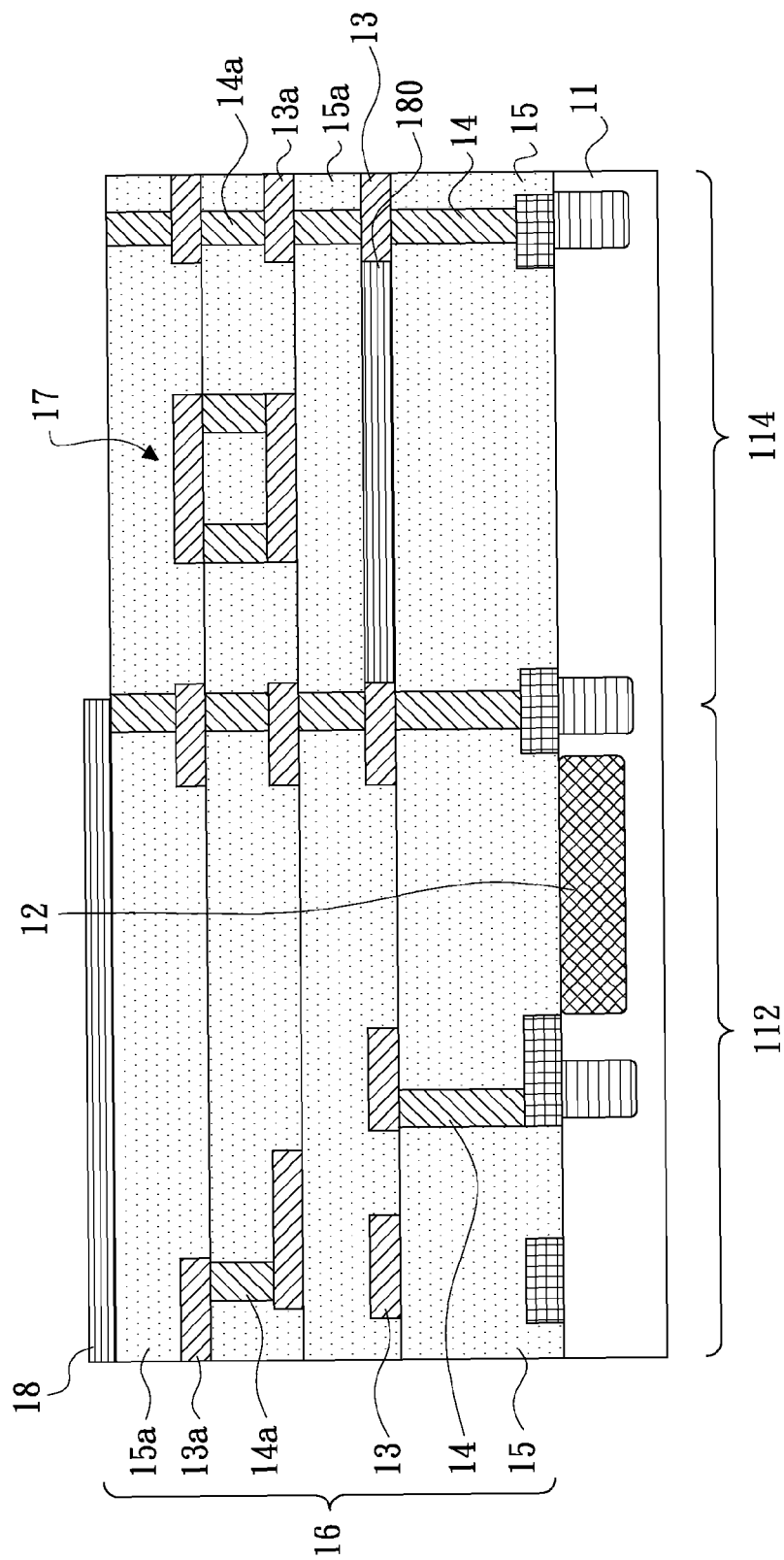

Referring to FIG. 1D, after the metallic layers 13a, the contact plugs 14a and the oxide layers 15a are formed, a protective layer 18 is formed on the interconnecting structure 16 so as to cover the interconnecting structure 16. Material of the interconnecting structure 16 can be amorphous silicon or silicon carbide.

Figure 1E:
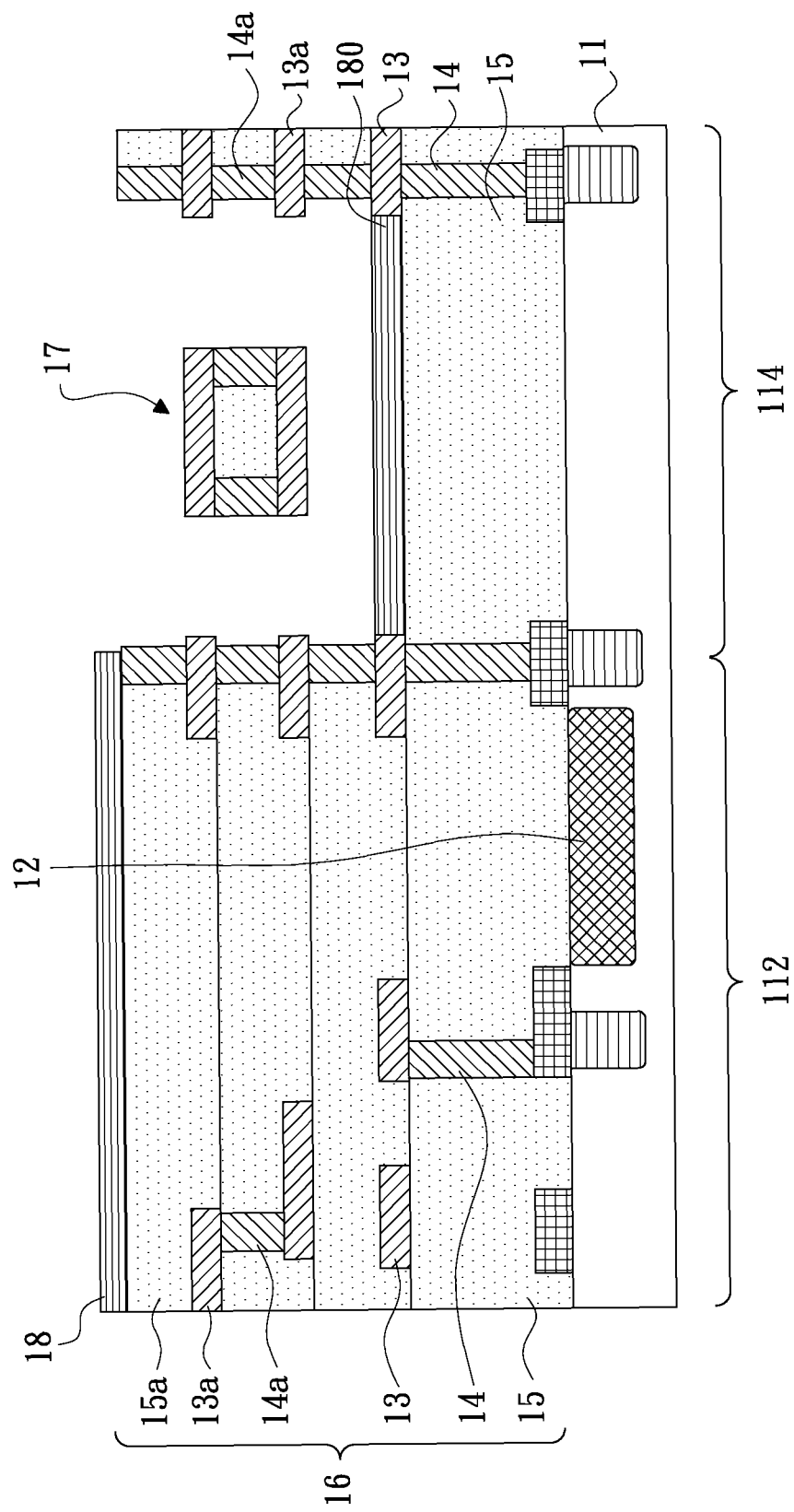

Referring to FIG. 1E, the predetermined portions of the oxide layers 15a located within the MEMS region 114 are removed, so as to make the MEMS structure 17 partially suspended above the substrate 11, and thus a MEMS element (not labeled) of the microelectronic device 10 is formed. In this embodiment, the predetermined portions of the oxide layers 15a located within the MEMS region 114 is removed by an etching process, such as gas etching process with xenon fluoride. Alternately, the portions of the oxide layers 15a located within the CMOS circuit region 112 are retained after performing the etching process because of the protection provided by the protective layer 18.

Similarly, since the protective layer 180 is formed on the portion of the oxide layer 15 within the MEMS region 114, the oxide layer 15 is not etched and retained on the substrate 11 after performing the etching process.

Figure 2:
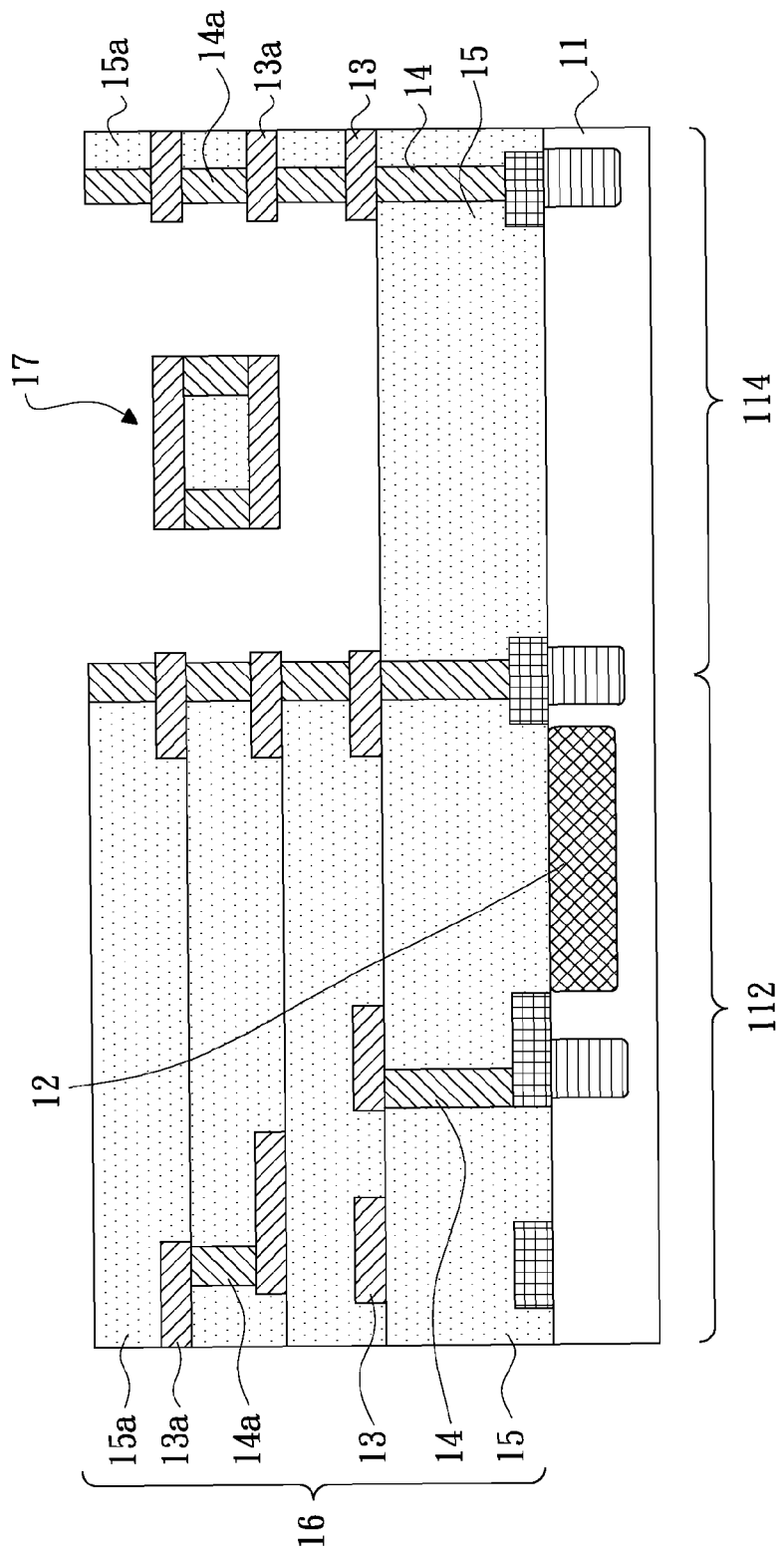
FIG. 2 is a partial, cross-sectional, schematic view of a microelectronic device according to another embodiment of the present invention.

Referring to FIG. 2, in this embodiment, the semi-conductor element 12 formed in the CMOS circuit region 112 is a photo sensor, and the protective layer 18 is removed after removing the oxide layers 15a located within the MEMS region 114. Therefore, the semi-conductor element 12 can be illuminated by external light radiated through the interconnecting structure 16.

It should be pointed out that, the method of removing the protective layer 18 is determined according to material of the protective layer 18. For example, if the protective layer 18 is made of amorphous silicon, the protective layer 18 can be removed by gas etching with xenon fluoride.

In this embodiment, material of the protective layer 180 can be the same as that of the protective layer 18. Therefore, the protective layer 18 and the protective layer 180 can be removed simultaneously. It should be pointed out that, if the protective layer 18 and the protective layer 180 both are made of amorphous silicon, the oxide layer 15 under the protective layer 180 can be used as an etching stop layer during the etching process of the protective layer 18 and the protective layer 180, so that the substrate 11 can avoid being etched by the xenon fluoride.

It should be noted that if the oxide layer 15 is doped with phosphorus ions, a mask can be employed while the protective layer 18 is etched. As such, the protective layer 180 can be retained on the substrate 11 for preventing the phosphorus ions doped into the oxide layer 15 from diffusing outwards. And thus, a stiction problem associated with the MEMS structure 17 can be prevented.

Figure 3:
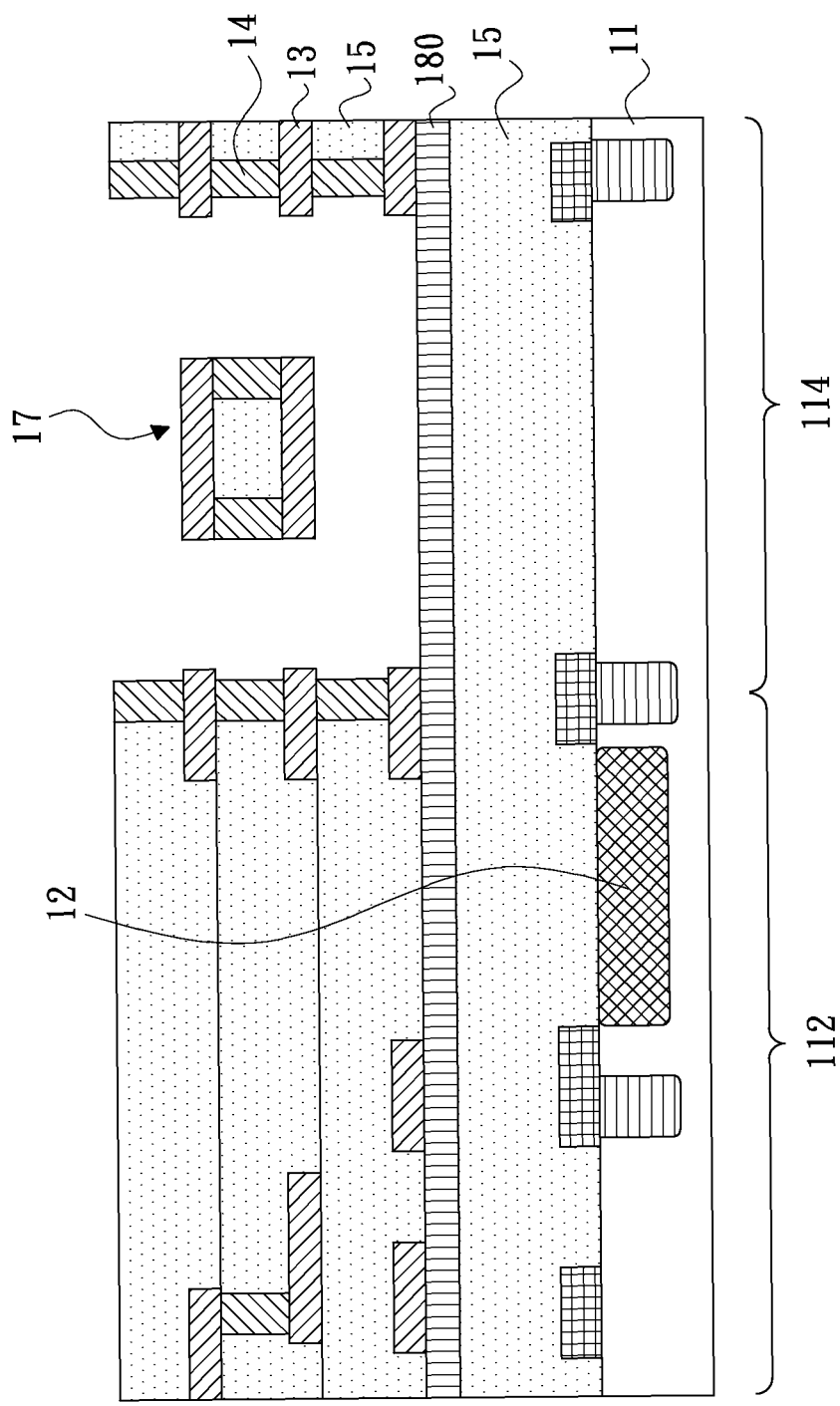
FIG. 3 is a partial, cross-sectional, schematic view of a microelectronic device according to another embodiment of the present invention.

In addition, if the semi-conductor element 12 is not a photosensitive component, the protective layer 180 can be formed above the CMOS circuit region 112 and the MEMS region 114 simultaneously during the process of the protective layer 180, as shown in FIG. 3.

In the aforementioned fabricating method of the microelectronic device, the CMOS circuit and the MEMS element may be integrated into a wafer, so that the subsequent fabrication procedure of the microelectronic device can be simplified, and thus a production cost thereof can be reduced.

Particularly, in the present invention, the MEMS element can further be packaged by the CMOS process, and some embodiments would be described as follows.

Figure 4A:
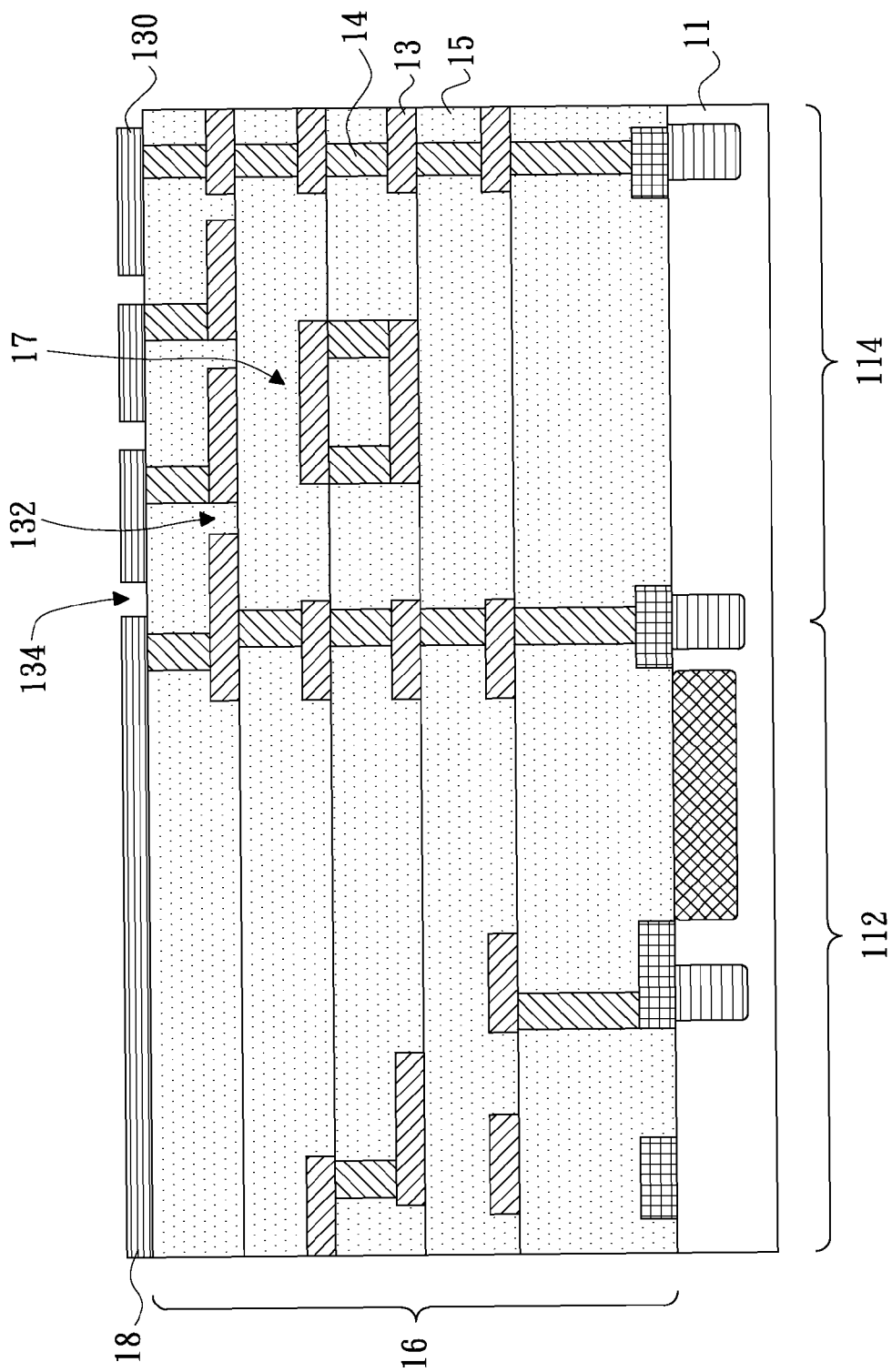
FIGS. 4A to 4C are schematic views of a microelectronic device during a fabricating process thereof according to another embodiment of the present invention.

Referring to FIG. 4A, the MEMS structure 17 is composed of a portion of the metallic layers 13, the contact plugs 14 and the oxide layers 15 disposed on the substrate 11, and the metallic layer 13 formed above the MEMS structure 17 has a plurality of first openings 132. Additionally, a mask layer 130 having a plurality second opening 134 can be formed above the MEMS structure 17. The second openings 134 and the first openings 132 are staggered with each other. In this embodiment, the protective layer 18 and the mask layer 130 have the same material and are formed in the same process. Therefore, the second opening 134 and the first openings 132 can be employed as etching channels during the etching process of the portions of the oxide layers 15 within the MEMS region 114.

Figure 4B:
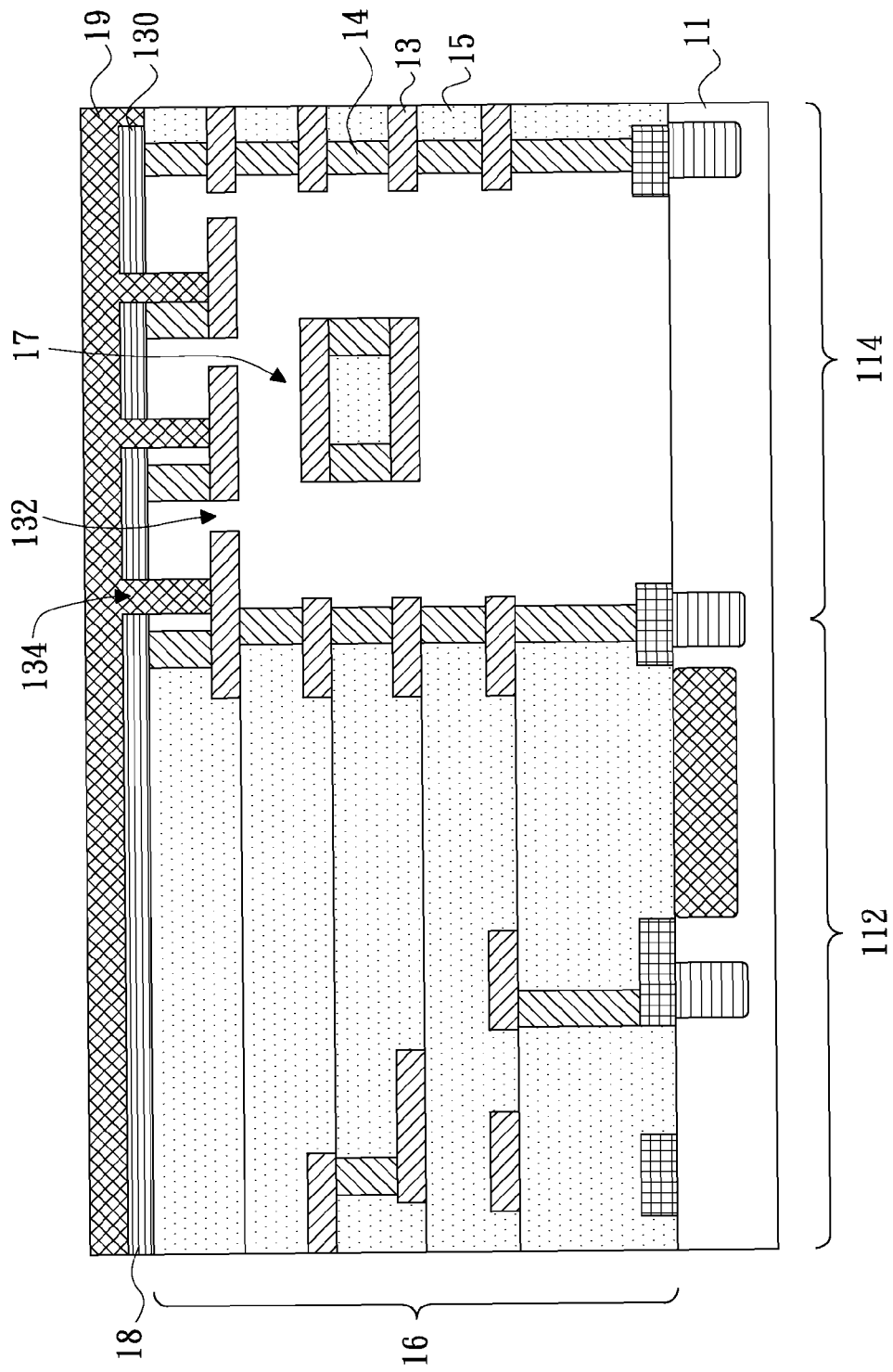

In this embodiment, the MEMS structure 17 can be further packaged by the CMOS process. Referring to FIG. 4B, after the portions of the oxide layers 15 within the MEMS region 114 are removed, a packaging layer 19 can be further formed on the protective layer 18 and the mask layer 130. The packaging layer 19 fills into the second openings 134 and thereby the MEMS element 17 is sealed between the metallic layers 13 and the substrate 11. As such, the MEMS element 17 can be prevented from being destroyed resulted from moisture and/or dust.

The packaging layer 19 may be made of silicon dioxide, aluminum, tungsten, amorphous silicon or silicon carbide. The protective layer 18 may be made of amorphous silicon or silicon carbide. Additionally, the mask layer 130 may be made of aluminum, amorphous silicon or silicon carbide.

Figure 4C:
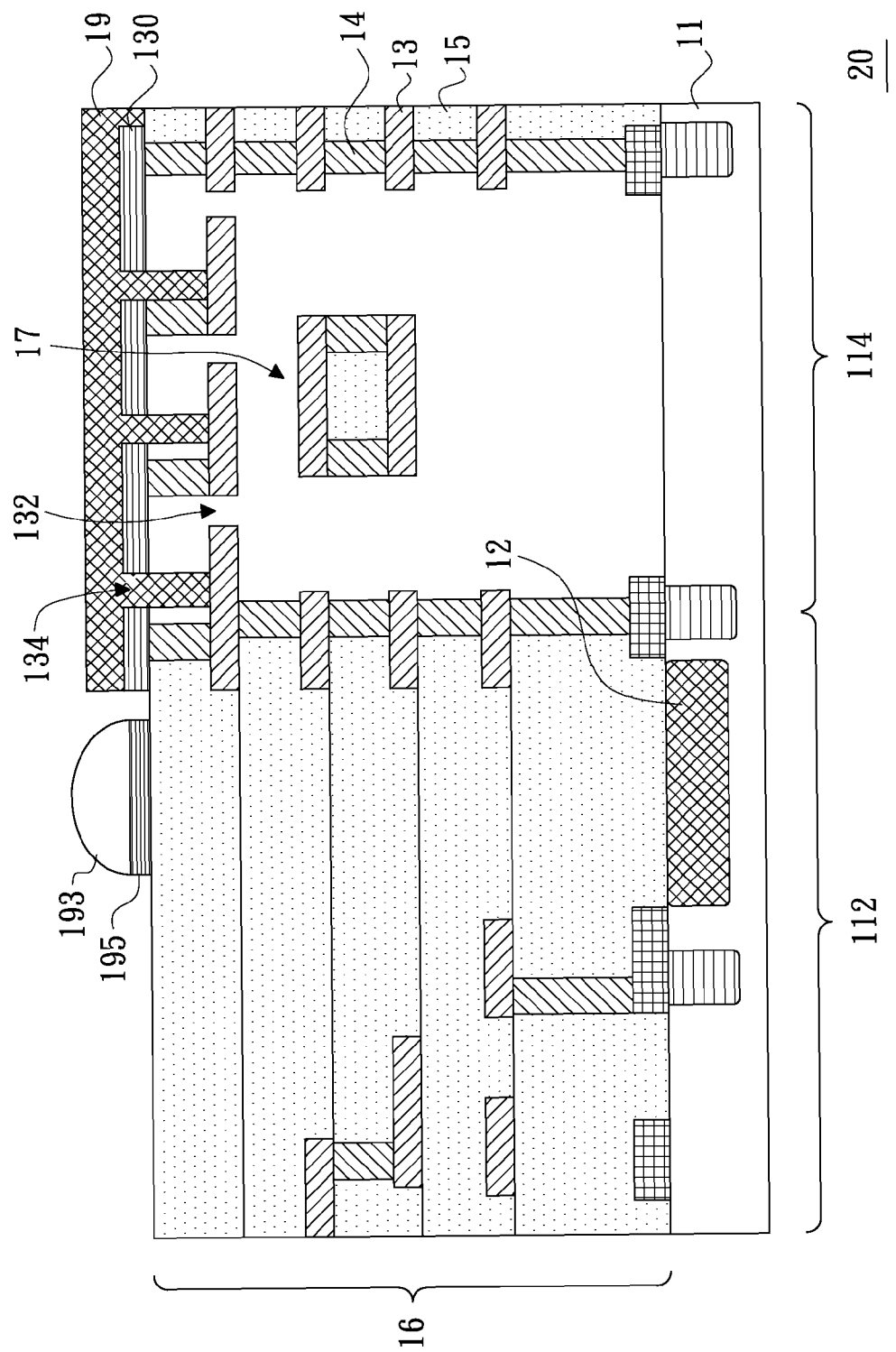

In addition, referring to FIG. 4C, the protective layer 18 above the interconnecting structure 16 and a portion of the packaging layer 19 within the CMOS circuit region 112 can be removed after forming the packaging layer 19. Then, a micro lens 193 is formed on the interconnecting structure 16 corresponding to the semi-conductor element 12. As such, the microelectronic device 20 is formed. Therefore, the external light can radiate through the micro lens 193 and the interconnecting structure 16 in sequence into the semi-conductor element 12. As described above, the method of removing the protective layer 18 and the packaging layer 19 are mainly dependent upon materials of the protective layer 18 and the packaging layer 19 correspondingly.

In alternative embodiment, a light filter 195 can be formed on the interconnecting structure 13 corresponding to the semi-conductor element 12 firstly, and then the micro lens 193 is formed on the light filter 195. Therefore, the microelectronic device 20 can provide a colorful light.

As the aforementioned, in the fabrication procedure of the CMOS circuit and the MEMS element, the MEMS structure 17 can also be packaged, thus the production cost can be reduced. It should be understood that, the package structure of the MEMS structure 17 and the fabricating method thereof can be used in the fabrication process of the MEMS element independently, and in the present invention, the MEMS structure 17 is not limited to fabricate and/or use with the CMOS circuit.

Figure 5:
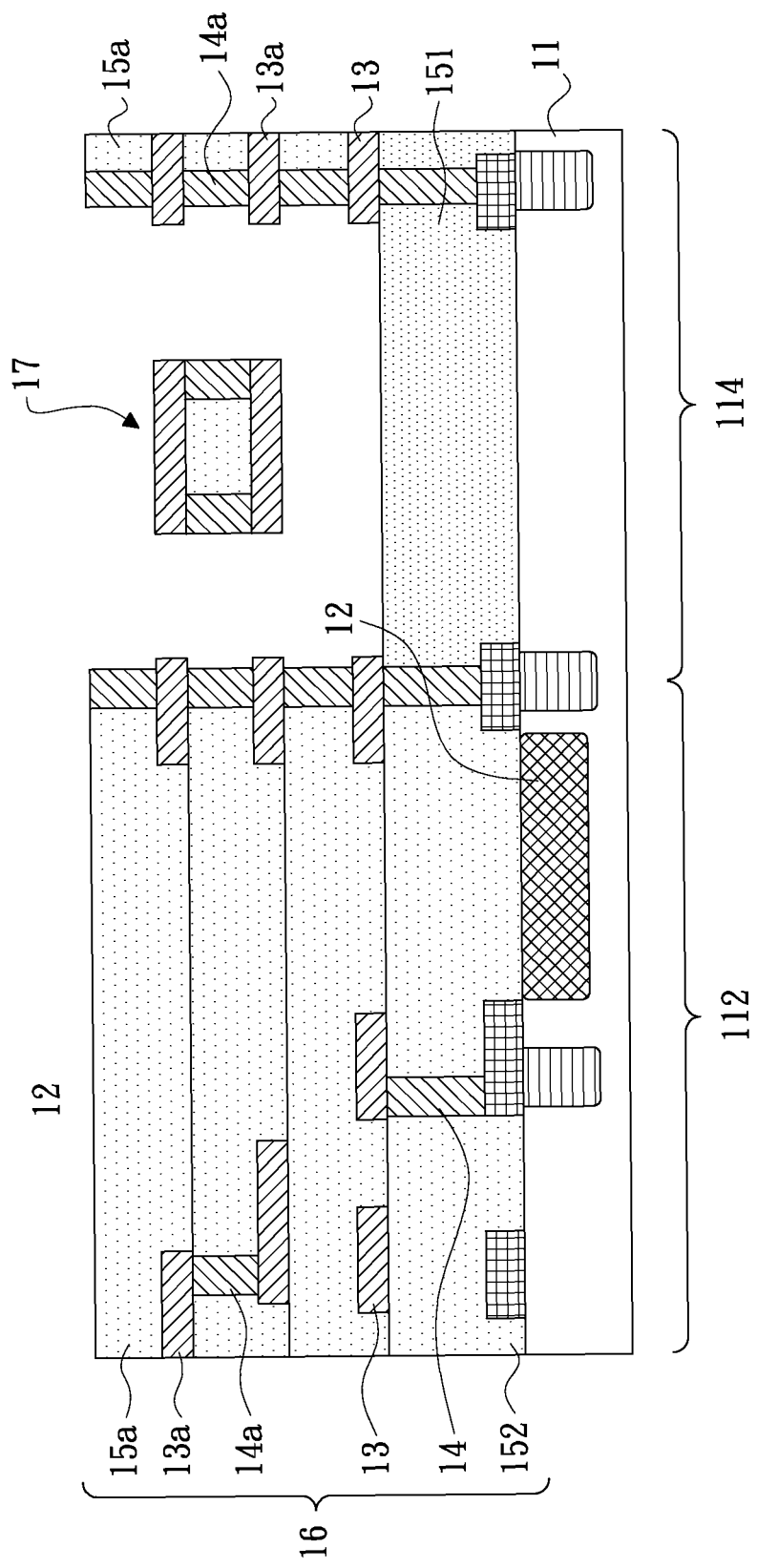
FIG. 5 is a partial, cross-sectional, schematic view of a microelectronic device according to another embodiment of the present invention.

FIG. 5 is a partial, cross-sectional, schematic view of a microelectronic device according to another embodiment of the present invention. Referring to FIG. 5, a microelectronic device includes a substrate 11, a semi-conductor element 12, an anti metal ion layer 152, a non-doping oxide layer 151 and a MEMS structure 17. The anti metal ion layer 152 is disposed on the substrate 11 within the CMOS circuit region 112 and covering the semi-conductor element 12. As such, the metal ions can be prevented from diffusing into the substrate 11 and destroying the semi-conductor element 12 and the CMOS circuit (not labeled) during the process of forming metallic layers on the substrate 11. Hence, the anti metal ion layer could be a diffusion barrier layer. In addition, the anti metal ion layer 152 can be made of phosphor silicate glass (PSG).

For preventing the stiction problem associated with the MEMS structure 17, in this embodiment, the non-doping oxide layer 151 is formed on the MEMS region 114 at first, and then the other steps are carried out subsequently. As such, the interconnecting structure 16 is formed on the anti metal ion layer 152, and the MEMS structure 17 is partially suspended above the non-doping oxide layer 151. In addition, the fabrication procedure of the interconnecting structure 16 and the MEMS structure 17 can be the same as or similar to the above embodiments.

As one can see from the above, because the MEMS structure 17 is partially suspended above the non-doping oxide layer 151, the stiction problem associated with the MEMS structure 17 can be prevented, and thus the performance of the microelectronic device can be improved.

In summary, in the method of fabricating the microelectronic device according to the embodiments of the present invention, the CMOS circuit and the MEMS element may be integrated into a wafer, so that the subsequent fabrication procedure can be simplified. Furthermore, in the present invention, because the MEMS structure can be packaged by the CMOS process, the packaging procedure of the microelectronic device can be reduced, and thus the production cost of the microelectronic device can be reduced.

In addition, the microelectronic device and the method of fabricating the same can solve the stiction problem that is associated with the MEMS element due to phosphorus ions. Therefore, the performance of the microelectronic device can be improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A MEMS package structure, comprising:
   a substrate;
   a MEMS structure partially suspended above the substrate;
   a metallic layer with a plurality of first openings disposed above the MEMS structure;
   a mask layer with a plurality of second openings disposed above the metallic layer, wherein the second openings and the first openings are staggered with each other; and
   a packaging layer disposed on the mask layer and filling into the second openings so as to connect to the metallic layer.

2. The MEMS package as claimed in claim 1, wherein materials of the mask layer and the packaging layer comprises metallic material or amorphous silicon.

3. The MEMS package as claimed in claim 2, wherein the materials of the mask layer and the packaging layer comprises aluminum.

4. A method for fabricating a MEMS package, comprising:
   providing a substrate;
   forming a plurality of metallic layers, a plurality of contact plugs and a plurality of oxide layers so as to compose a MEMS structure, wherein one of the metallic layers disposed above the MEMS structure has a plurality of first openings;
   forming a mask layer with a plurality of second openings on the top one of the metallic layers, the second openings and the first openings being staggered with each other;
   removing predetermined portions of the oxide layers by employing the first openings and the second openings as etching channels, thereby making the MEMS structure partially suspended above the substrate; and
   forming a packaging layer on the mask layer, the packaging layer filling into the second openings, thereby sealing the MEMS structure between the metallic layers and the substrate.

5. The method for fabricating a MEMS package as claimed in claim 4, wherein a removing method of the predetermined portions of the oxide layers comprises hydrofluoric acid vapor etching.

* * * * *